(12) United States Patent
Lao et al.

(10) Patent No.: US 11,374,096 B1
(45) Date of Patent: Jun. 28, 2022

(54) HIGH VOLTAGE SEMICONDUCTOR DEVICE

(71) Applicant: Vanguard International Semiconductor Corporation, Hsinchu (TW)

(72) Inventors: Chung-Ren Lao, Taichung (TW); Kuan-I Ho, New Taipei (TW); Kuo-Chien Hsu, Taipei (TW); Che-Hua Chang, Hsinchu (TW); Hsiao-Ying Yang, Hsinchu (TW); Chih-Cherng Liao, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 17/140,140

(22) Filed: Jan. 4, 2021

(51) Int. Cl.
*H01L 29/06* (2006.01)
*H01L 29/10* (2006.01)
*H01L 29/40* (2006.01)
*H01L 29/78* (2006.01)

(52) U.S. Cl.
CPC ........ *H01L 29/404* (2013.01); *H01L 29/0653* (2013.01); *H01L 29/1095* (2013.01); *H01L 29/7816* (2013.01)

(58) Field of Classification Search
CPC ..... H01L 29/06; H01L 29/0653; H01L 29/10; H01L 29/1095; H01L 29/40; H01L 29/404; H01L 29/78; H01L 29/7802; H01L 29/7816

USPC .......................................................... 257/339
See application file for complete search history.

(56) References Cited

U.S. PATENT DOCUMENTS

| | | | |
|---|---|---|---|
| 2016/0315189 A1* | 10/2016 | Song | H01L 29/7835 |
| 2019/0229214 A1 | 7/2019 | Chen | |
| 2019/0311969 A1 | 10/2019 | Liaw | |
| 2020/0083233 A1 | 3/2020 | Wu | |
| 2020/0350400 A1 | 11/2020 | Lee | |
| 2021/0184005 A1* | 6/2021 | Liu | H01L 29/402 |
| 2021/0234042 A1* | 7/2021 | Xu | H01L 29/7816 |

FOREIGN PATENT DOCUMENTS

| | | | |
|---|---|---|---|
| TW | 201733126 | * | 9/2017 |
| TW | 202143484 | * | 11/2021 |

* cited by examiner

*Primary Examiner* — Fazli Erdem
(74) *Attorney, Agent, or Firm* — Winston Hsu

(57) ABSTRACT

The present disclosure provides a high voltage semiconductor device includes a substrate, a first well region, a second well region, a source, a drain, a first electrode structure and a second electrode structure. The first well region and the second well region are disposed in the substrate, and which includes a first conductive type and a second conductive type which are complementary with each other. The source and the drain are respectively disposed within the first well region and the second well region. The first electrode structure and the second electrode structure are both disposed on the substrate, and the distance between the top surface of an electrode of the first electrode structure and the top surface of the substrate includes a first height and a second height which are different from each other.

14 Claims, 8 Drawing Sheets

HIGH VOLTAGE SEMICONDUCTOR DEVICE

BACKGROUND OF THE INVENTION

1. Field of the Invention

The present disclosure relates to a semiconductor device, and more particularly, to a high voltage semiconductor device.

2. Description of the Prior Art

With improvement in semiconductor manufacturing, it is conceivable to fabricate control circuits, memories, low-voltage circuits, high voltage circuits, and the related devices in a single chip for reducing costs and improving performance. And a MOS transistor device, which is widely applied for enlarging currents or signals in a circuit, serving as an oscillator of a circuit, or serving as a switch device of a circuit, is further applied to be the high power device or the high voltage device based on the development of semiconductor processes. For example, a MOS transistor device, serving as a high voltage device, is applied in between the internal circuits and the I/O terminals for preventing a large number of charges from suddenly spiking into the internal circuits and thus to avoid the resulted damage to the internal circuit.

In the current transistor which is applied on high voltage device, the breakdown voltage thereof is increased mainly by disposing a drift region in the structure of the transistor. Besides, a field plate structure may also be formed in the structure of the transistor, for example, by further extending one end of the gate till being above an isolation structure, so that the surface electric field at the end of the gate may be dispersed. However, the existing high voltage semiconductor devices are not satisfactory in all aspects, and need to be further improved to meet the practical requirements in the industry.

SUMMARY OF THE INVENTION

It is one of the objectives of the present disclosure to provide a high voltage semiconductor device, in which, several field plate structures with various height are disposed, to avoid excessively increasing the lateral distance between the gate electrode and the drain. Through these arrangement, the high voltage semiconductor device may effectively reduce the parasitic capacitance and increase breakdown voltage thereof, which is beneficial to improve the reliability of the device.

A preferable embodiment of the present disclosure provides a high voltage semiconductor device including a substrate, a first well region, a second well region, a first insulating layer, a source, a drain, a first electrode structure and a second electrode structure. The first well region is disposed in the substrate and has a first conductive type. The second well region is disposed in the substrate, adjacent to the first well region, wherein the second well region has a second conductive type which is complementary to the first conductive type. The first insulating layer is disposed on the first well region. The source is disposed within the second well region, and the drain is disposed within the second well region. The first electrode structure and the second electrode structure are both disposed on the substrate, with distances between a top surface of an electrode of the first electrode structure and a top surface of the substrate having a first height and a second height which are different from each other, wherein at least one of the first electrode structure and the second electrode structure includes a gate structure.

The high voltage semiconductor device of the present disclosure includes two or more than two independently arranged electrode structures, such as a gate structure or a capacitor structure including a stack structure of polysilicon, an insulator and a conductor, and insulating layers disposed between the two electrode structures and the substrate, with the insulating layers having different thicknesses, being arranged at different positions or being covered by the two electrode structures with different percentages. Accordingly, the distances between the top surface of each of the electrode structures and the top surface of the substrate, or the distances between the top surface of the electrode structures and the top surface of the substrate through different insulating layers, different dielectric layers or a combination of the insulating layers and dielectric layers, may have various heights, so that, plural field plates with various height may be formed thereby within the high voltage semiconductor device to achieve significantly higher breakdown voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
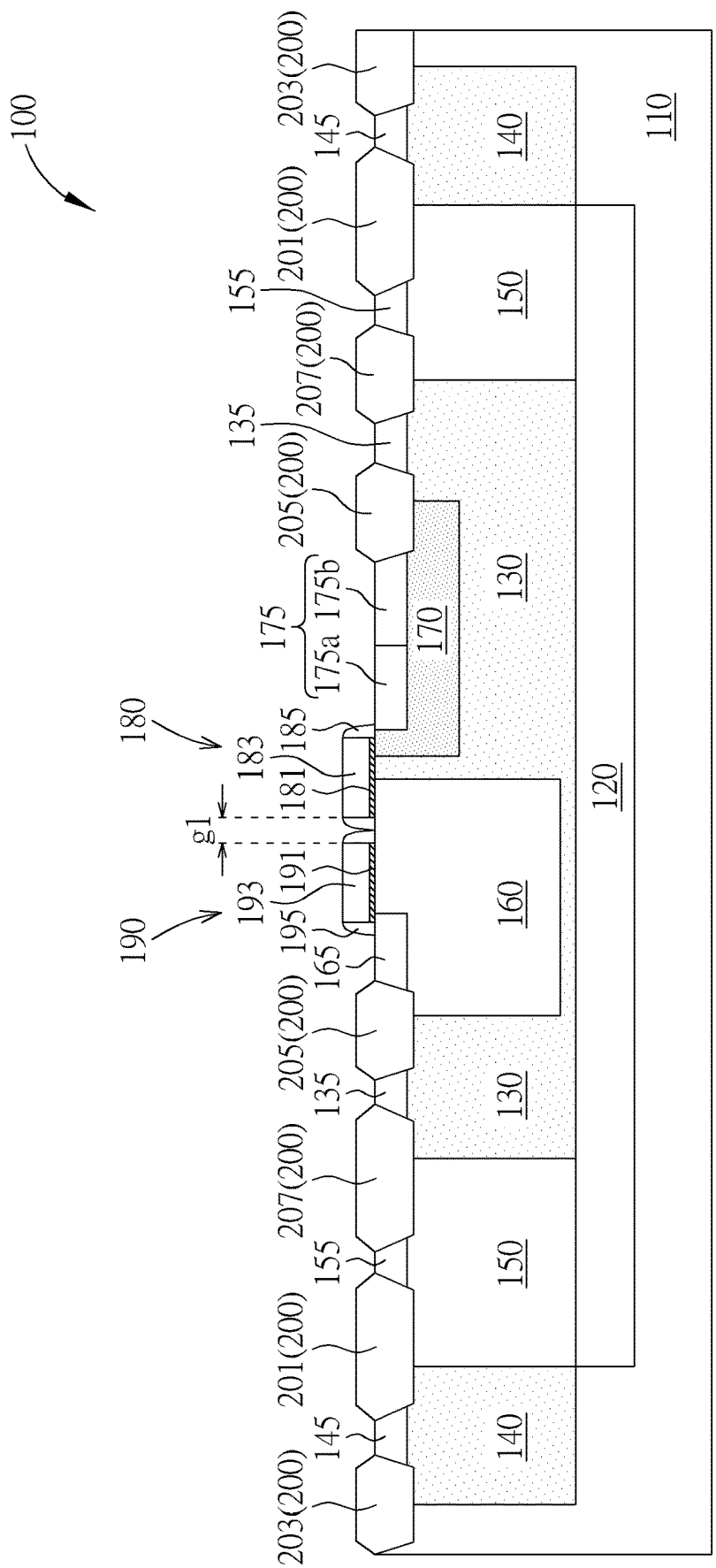
FIG. 1 is a schematic diagram illustrating a cross-sectional view of a high voltage semiconductor device according to a first embodiment of the present disclosure.

For better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

In the present disclosure, the formation of a first feature over or on a second feature in the description may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Furthermore, spatially relative terms, such as "beneath," "below," "lower," "over," "above," "upper" and the like, may be used herein for ease of description to describe one element or feature's relationship to another element (s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, preferably within 10%, and more preferably within 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Please refers to FIG. 1, which illustrates a high voltage semiconductor device 100 according to the first embodiment of the present disclosure. The high voltage semiconductor device 100 of the present disclosure refers to a semiconductor device having an operating voltage being about 20-40 volts (V), for example it may be a laterally diffused metal oxide semiconductor transistor (LDMOS transistor) such as an n-type LDMOS or a p-type LDMOS. In the present embodiment, the high voltage semiconductor device 100 is exemplified as an n-type LDMOS, but is not limited thereto.

Firstly, as shown in FIG. 1, the high voltage semiconductor device 100 includes a substrate 110, such as a silicon substrate, an epitaxial silicon substrate, a silicon germanium substrate, a silicon carbide substrate or a silicon-on insulator (SOI) substrate, and a buried layer 120, a first well region 160 and a second well region 130 disposed in the substrate 110. Precisely, the first well region 160 includes a first conductive type (for example the n-type), and a drain 165 is disposed within the first well region 160. The drain 165 for example includes a doped region also including the first conductive type (such as n-type), with the doped concentration of the doped region being greater than the doped concentration of the first well region 160. On the other hand, the second well region 130 is disposed adjacent to the first well region 160, and which includes a second conductive type (such as p-type) being complementary to the first conductive type (such as n-type). In the present embodiment, the depth of the second well region 130 within the substrate 110 may be slightly greater than the depth of the first well region 160 within the substrate 110, so that, the second well region 130 may surround the periphery of the first well region 160 when perceived from a cross-sectional view as shown in FIG. 1. In other words, the first well region 160 may be entirely surrounded by the second well region 130 via a top view (not shown in the drawing), but is not limited thereto. In another embodiment, the first well region 160 may be disposed around an outer periphery of the second well region 130, but is not limited thereto.

A source 175 is formed in the second well region 130. In one embodiment, a third well region 170 is further formed within the second well region 130, and the source 175 may be disposed within the third well region 170, with the third well region 170 also including the second conductive type (such as p-type) and with the doped concentration of the third well region 170 being greater than the doped concentration of the second well region 130. The source 175 further includes a first doped region 175a and a second doped region 175b adjacent to each other. The first doped region 175a and the second doped region 175b include the first conductive type (such as n-type) and the second conductive type (such as p-type) respectively, and the doped concentration of the first doped region 175a or the second doped region 175b is greater than the doped concentration of the second well region 130 or the third well region 170. As shown in FIG. 1, the buried layer 120 is further disposed below the first well region 160 and the second well region 130 to be configured as an isolation structure or an anti-punch-through structure of the high voltage semiconductor device 100, thereby preventing the current from directly punching through the bottom or inner of the substrate 110 from the first well region 160 to damage to the device performance of the high voltage semiconductor device 100. In the present embodiment, the buried layer 120 for example includes the first conductivity type (such as n-type), and the doping concentration of the buried layer 120 is preferably greater than that of the first well region 160 or the second well region 130.

Furthermore, a body region 135 is formed in the second well region 130. The body region 135 includes the second conductive type (for example the p-type), and the doped concentration of the body region 135 is preferably greater than the doped concentration of the second well region 130. In one embodiment, the body region 135 preferably not directly contacts the drain 165 disposed in the first well region 160, or not directly contacts the source 175 disposed in the second well region 130. For example, a plurality of insulating structures 200 is optionally disposed on the substrate 110. As shown in FIG. 1, the insulating structures 200 may be a field oxide (FOX) layer which is formed for example through a local oxidation of silicon (LOCOS) process, but is not limited thereto. In another embodiment, the insulating structures 200 may also be a shallow trench isolation (STI) which is formed through a deposition process. Precisely, two insulating structures 205, 207 are respectively disposed at two opposite sides of the body region 135, with the body region 135 and the drain 165, or with the body region 135 and the source 175 being separated by the insulating structure 205, as shown in FIG. 1. Accordingly, the drain 165 and the body region 135 may be electrically isolated from each other, and the body region 135 may be electrically connected to the first doped region 175a and the second doped region 175b of the source 175 through an external circuit (not shown in the drawings), with the body region 135 and the source 175 having equal potential, but not limited thereto. In other words, the body region 135 and each of the isolation structures 200 (such as the aforementioned isolation structures 205, 207) may include a ring shape from a top view (not shown in the drawings), for example being a square shape, a circular shape, a racetrack shape or other suitable shapes, and then, the body region 135 may be disposed around the periphery of the source 165 and the drain 175, with the insulating structure 205 and the insulating structure 207 further surrounding the inner side and the outer side of the body region 135 respectively. However, people in the arts should fully realize the practical arrangement of the body region and the insulating structures is not limited thereto.

Also, in one embodiment, the substrate 110 of the high voltage semiconductor device 100 may further include an isolation region, which may be connected to an isolation voltage ($V_{iso}$) to isolate the high voltage circuit within the high voltage semiconductor device 100. The isolation region for example includes a deep well region 150 surrounding around the periphery of the second well region 130, and an isolation region 155 disposed within the deep well region 150, as shown in FIG. 1, wherein the deep well region 150 and the isolation region 155 both include the first conductive type (such as n-type), and the doped concentration of the isolation region 155 is preferably greater than the doped concentration of the deep well region 150. In another embodiment, the substrate 110 of the high voltage semiconductor device 100 may further include another body region 145 which is disposed in a fourth well region 140 to surround the periphery of the high voltage semiconductor device 100. The another body region 145 and the fourth well region 140 also have the second conductivity type (such as p-type), thereby further isolating the high voltage semiconductor device 100 from other active devices, such as another high voltage semiconductor device or the like. Then, the two insulating structures 201, 203 are respectively disposed at the two opposite sides of the another body region 145, to separate the isolation region 155 by the insulating structure 201, as shown in FIG. 1.

In the present embodiment, two independently disposed electrode structure, such as the first gate structure 180 and the second gate structure 190 being separately from each other, are disposed between the source 175 and the drain 165, as shown in FIG. 1. Precisely, the first gate structure 180 and the second gate structure 190 may respectively include a gate dielectric layer 181, 191 and a gate electrode 183, 193 stacked on the substrate 110, and a spacer 185, 195 surrounding the gate dielectric layer 181, 191 and the gate electrode 183, 193. The gate electrode 183 of the first gate structure 180 and the gate electrode 193 of the second gate structure 190 are separately from each other, and the gap g1 between the gate electrode 183 and the gate electrode 193 may be about 0.1 micrometer (μm) to 0.2 μm, preferably being about 0.13 μm to 0.16 μm, but not limited thereto. Preferably, the gap g1 between the gate electrode 183 of the first gate structure 180 and the gate electrode 193 of the second gate structure 190 is located within the area of the first well region 160, and the gap g1 may be reduced as much as possible, so that the spacers 185, 195 both at one side of the first gate structure 180 and the second gate structure 190 may be directly in contact with each other as shown in FIG. 1, or the spacers (not shown in the drawings) may merger together. With such arrangement, the first gate structure 180 and the second gate structure 190 may provide different voltages, thereby improving the device performance of the high voltage semiconductor device 100. People well-skilled in the art may easily understand that the voltages of the first gate structure 180 and the second gate structure 190 may be further adjusted according to practical requirements. For example different fixed or variable voltages may be provided to the first gate structure 180 and the second gate structure 190 respectively.

In one embodiment, the gate electrodes 183, 193 of the first gate structure 180 and the second gate structure 190 include silicon or polysilicon. The first gate structure 180 and the second gate structure 190 may include dopants for reducing sheet resistance. In another embodiment, the gate electrodes 183, 193 of the first gate structure 180 and the second gate structure 190 may also include other materials, such as amorphous silicon, aluminum (Al), copper (Cu), gold (Au), silver (Ag), tungsten (W), titanium (Ti), tantalum (Ta), nickel (Ni), cobalt (Co), ruthenium (Ru), palladium (Pd), plaTiNum (Pt), manganese (Mn), tungsten nitride (WN), titanium nitride (TiN), tantalum nitride (TaN), molybdenum nitride (MoN), tungsten silicide (WSi), titanium silicide ($TiSi_2$), other suitable conductive materials, or a combination thereof. In addition, a metal silicide layer may be additionally formed on surface of the gate electrodes 183, 193 of the first gate structure 180 and the second gate structure 190. In a preferably embodiment, the gate electrodes 183, 193 of the first gate structure 180 and the second gate structure 190 may optionally include the same material.

In order to meet the practical product requirements, people skilled in the arts should easily understand that the high voltage semiconductor device of the present disclosure is not limited to be aforementioned, and which may include other variations. For example, in the aforementioned embodiment, while the distance between the gate structure and the drain 165 is shorten to reduce the parasitic capacitance, the gate structure may be further closed to the electric field strength at the drain 165 side, which may result in the reduce of the breakdown voltage of the high voltage semiconductor device 100. The following description will detail the different embodiments of the high voltage semiconductor device in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 2:
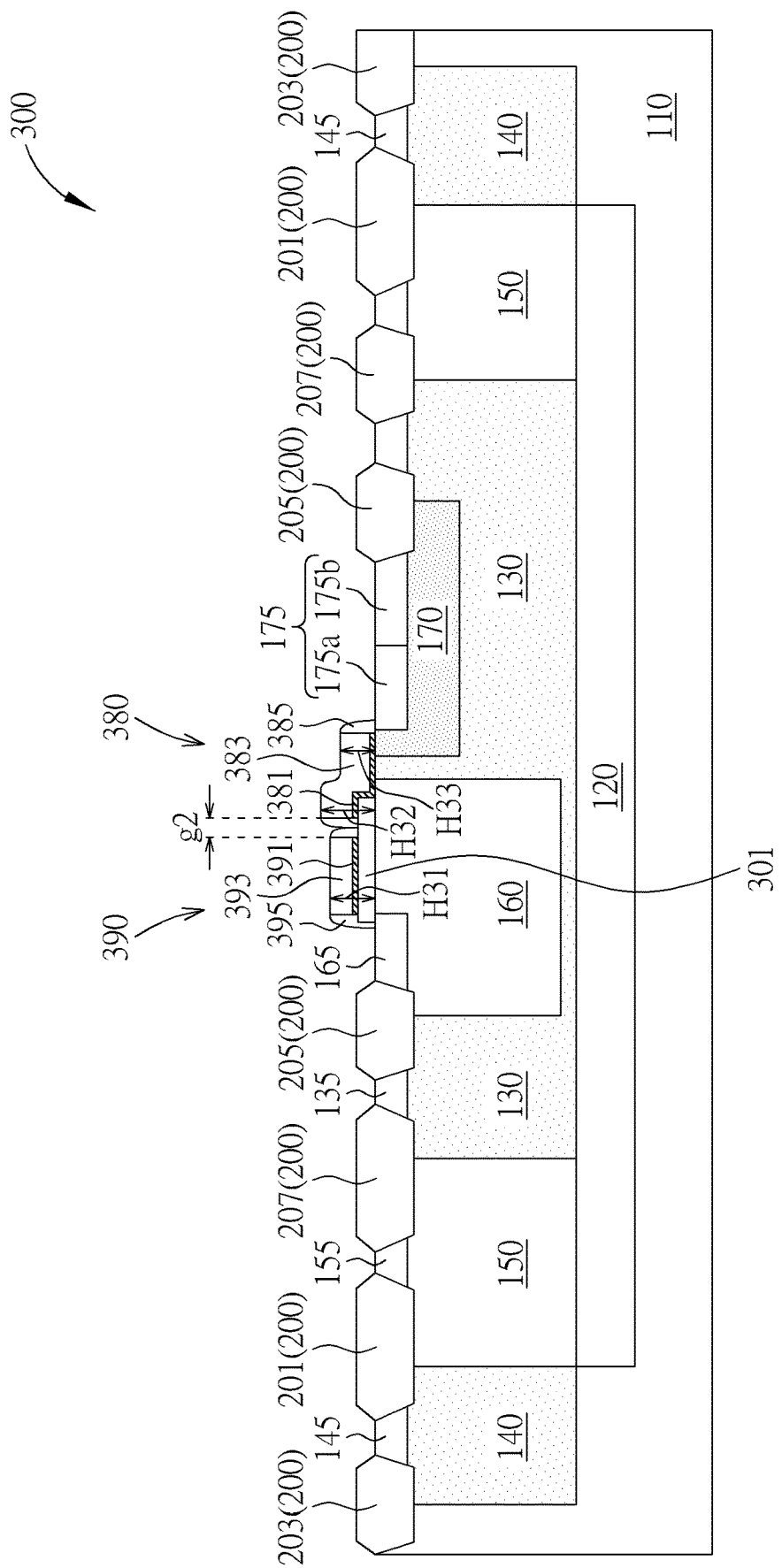
FIG. 2 is a schematic diagram illustrating a cross-sectional view of a high voltage semiconductor device according to a second embodiment of the present disclosure.

Please refer to FIG. 2, which illustrate a high voltage semiconductor device 300 according to the second embodiment of the present disclosure. The structure of the high voltage semiconductor device 300 of the present embodiment is substantially similar to the high voltage semiconductor device 100 in the aforementioned first embodiment, and which also includes the substrate 110, the first well region 160, the second well region 130, the drain 165, the source 175, the body region 135, and the insulating structures 200. All similarity between the present embodiment and the aforementioned embodiment will not be redundantly described hereinafter. The difference between the present embodiment and the aforementioned embodiment is mainly in that an insulating layer 301 is additionally disposed on the first well region 160 between the source 175 and the drain 163, and two independently disposed electrode structure (such as a first gate structure 380 and a second gate structure 390 as shown in FIG. 2) may be completely or partially straddled on the insulating layer 301.

Likewise, the first gate structure 380 and the second gate structure 390 may respectively include a gate dielectric layer 381, 391 and a gate electrode 383, 393 stacked on the substrate 110, and a spacer 385, 395 surrounding the gate dielectric layer 381, 391 and the gate electrode 383, 393. Precisely, the first gate structure 380 is, for example, disposed over the interface between the first well region 160 and the second well region 130, that is, the first gate structure 380 namely crosses the interface between the first well region 160 and the second well region 130. The second gate structure 390 is disposed adjacent to the first gate structure 380, and which is completely disposed within the first well region 160, without overlapping with the second well region 130. With these arrangements, the gate electrode 383 of the first gate structure 380 and the gate electrode 393 of the second gate structure 390 may be separately from each other, and the gap g2 between the gate electrode 383 and the gate electrode 393 may be about 0.1 µm to 0.2 µm, preferably being about 0.13 µm to 0.16 µm, but not limited thereto. Preferably, the gap g2 between the gate electrode 383 and the gate electrode 393 is located within the area of first well region 160, over the insulating layer 301, as shown in FIG. 2. In one embodiment, the insulating layer 301 for example includes a dielectric material layer such as a silicon oxide layer which is formed through a deposition process, but is not limited thereto. Preferably, the thickness of the insulating layer 301 is greater than the thickness of the gate dielectric layers 381, 391 of the first gate structure 380 or the second gate structure 390. However, people in the arts should fully understand that the specific thickness, oxygen content, density and other parameters of the insulating layer 301 may all be adjusted according to the practical product requirements.

In the present embodiment, the second gate structure 390 is completely disposed over the insulating layer 301, so that, the distance H31 between the gate electrode 393 and the substrate 110 is a certain value, wherein the distance H31 refers to the height from the top surface of the gate electrode 393 to the top surface of the substrate 110. On the other hand, a portion of the first gate structure 380 is straddled on the insulating layer 301 and another portion of the first gate structure 380 is directly disposed on the substrate 110, so that, the distance H32 between the portion of the gate electrode 383 which is disposed on the insulating layer 301 and the substrate 110, and the distance H33 between the another portion of the gate electrode 383 and the substrate 110 may be different from each other. Accordingly, the distance H31 from the top surface of gate electrode 393 of second gate structure 390 through the insulating layer 301 to the top surface of substrate 110, the distance H33 directly from the top surface of gate electrode 383 of first gate structure 380 to the top surface of substrate 110, and the distance H32 from the top surface of gate electrode 383 of first gate structure 380 through the insulating layer 301 to the top surface of substrate 110 may generate field plates with various heights, thereby reducing the surface field (RESURF) to beneficial on improving the breakdown voltage of the high voltage semiconductor device 300.

Figure 3:
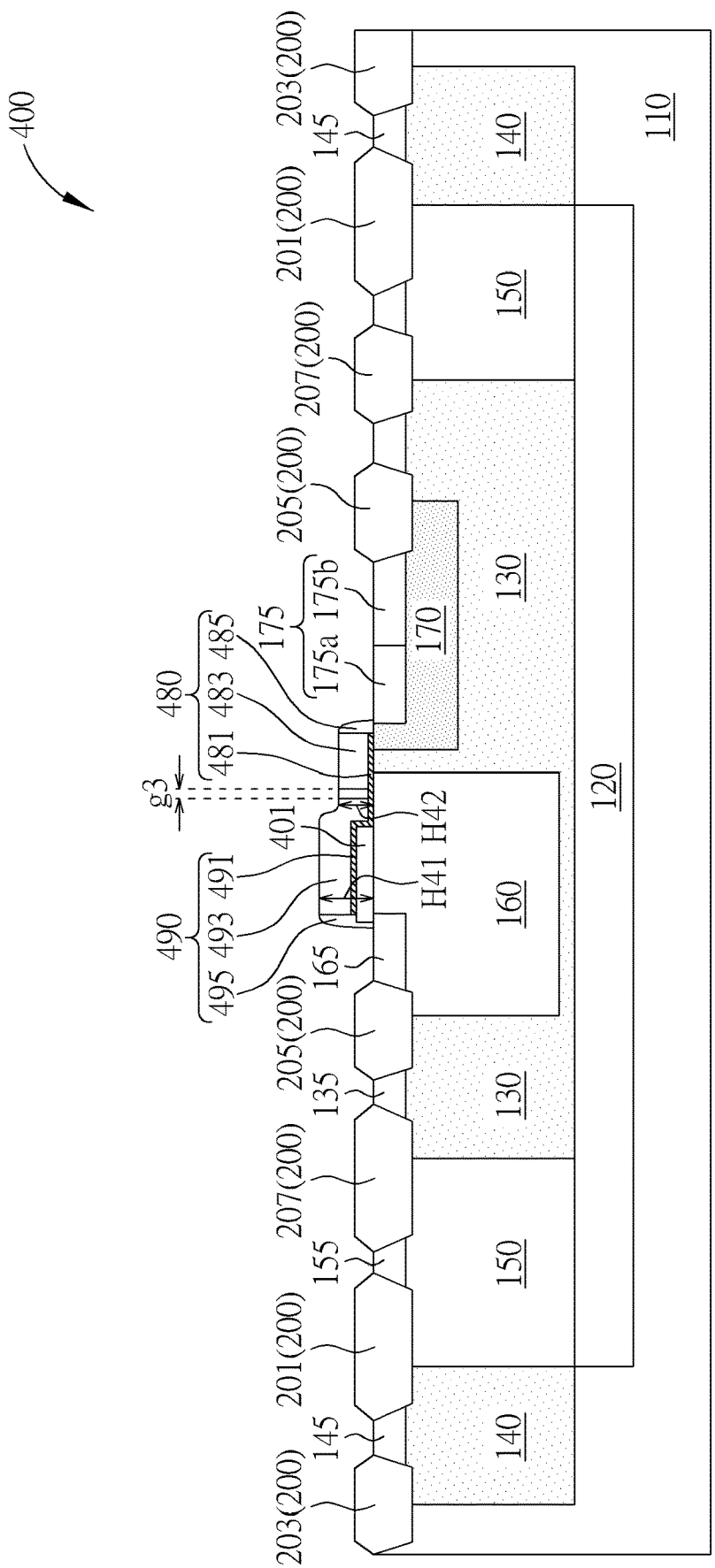
FIG. 3 is a schematic diagram illustrating a cross-sectional view of a high voltage semiconductor device according to a third embodiment of the present disclosure.

As shown in FIG. 3, FIG. 3 illustrates a high voltage semiconductor device 400 according to the third embodiment of the present disclosure. The structure of the high voltage semiconductor device 400 of the present embodiment is substantially similar to the high voltage semiconductor device 300 in the aforementioned second embodiment, and all similarity between the present embodiment and the aforementioned embodiment will not be redundantly described hereinafter. The difference between the present embodiment and the aforementioned embodiment is mainly in that the first gate structure 480 of the high voltage semiconductor device 400 is directly disposed on the substrate 110, and the second gate structure 490 is partially disposed on an insulating layer 401. In the present embodiment, the insulating layer 401 may also include a dielectric material layer such as a silicon oxide layer which is formed through a deposition process, with all of the parameters and conditions of the insulating layer 401 being adjustable based on practical product requirements. The thickness of the insulating layer 401 is preferably greater than the thickness of a gate dielectric layers 481 of the first gate structure 480 or a gate dielectric layers 491 of the second gate structure 490, but is not limited thereto.

Likewise, the first gate structure 480 and the second gate structure 490 may respectively include a gate dielectric layer 481, 491 and a gate electrode 483, 493 stacked on the substrate 110, and a spacer 485, 495 surrounding the gate dielectric layer 481, 491 and the gate electrode 483, 493. Precisely, the first gate structure 480 is also disposed over the interface between the first well region 160 and the second well region 130, and the second gate structure 490 is completely disposed within the first well region 160, adjacent to the first gate structure 480. With these arrangements, the gate electrode 483 of the first gate structure 480 and the gate electrode 493 of the second gate structure 490 may also be separately from each other, and the gap g3 between the gate electrode 483 and the gate electrode 493 may be about 0.1 µm to 0.2 µm, preferably being about 0.13 µm to 0.16 µm, but not limited thereto. In the present embodiment, the spacers 485, 495 both at one side of the first gate structure 480 and the second gate structure 490 may be merged with each other due to the smallness of the gap g3, and then, the gate dielectric layers 481, 491 of the first gate structure 480 and the second gate structure 490 are connected with each other to be monolithic, as shown in FIG. 3. Accordingly, the gap g3 between the gate electrodes 483 and the gate electrode 493 may be disposed over the gate dielectric layers 481, 491, and which is still located within the area of the first well region 160, as shown in FIG. 3.

Furthermore, a portion of the second gate structure 490 is straddled on the insulating layer 401 and another portion of the second gate structure 490 is directly disposed on the substrate 110, so that, the distance H41 between the portion of the gate electrode 493 which is disposed on the insulating layer 401 and the substrate 110, and the distance H42 between the another portion of the gate electrode 493 which is directly disposed on the substrate 110 and the substrate 110 may be different from each other. Accordingly, the distance H42 from the top surface of gate electrode 483 of first gate structure 480 to the top surface of substrate 110, the distance H42 from the top surface of gate electrode 493 of second gate structure 490 to the top surface of substrate 110, and the distance H41 from the top surface of gate electrode 493 of second gate structure 490 through the insulating layer 401 to the top surface of substrate 110 may generate field plates with two different heights, which is also beneficial on improving the breakdown voltage of the high voltage semiconductor device 400.

Figure 4:
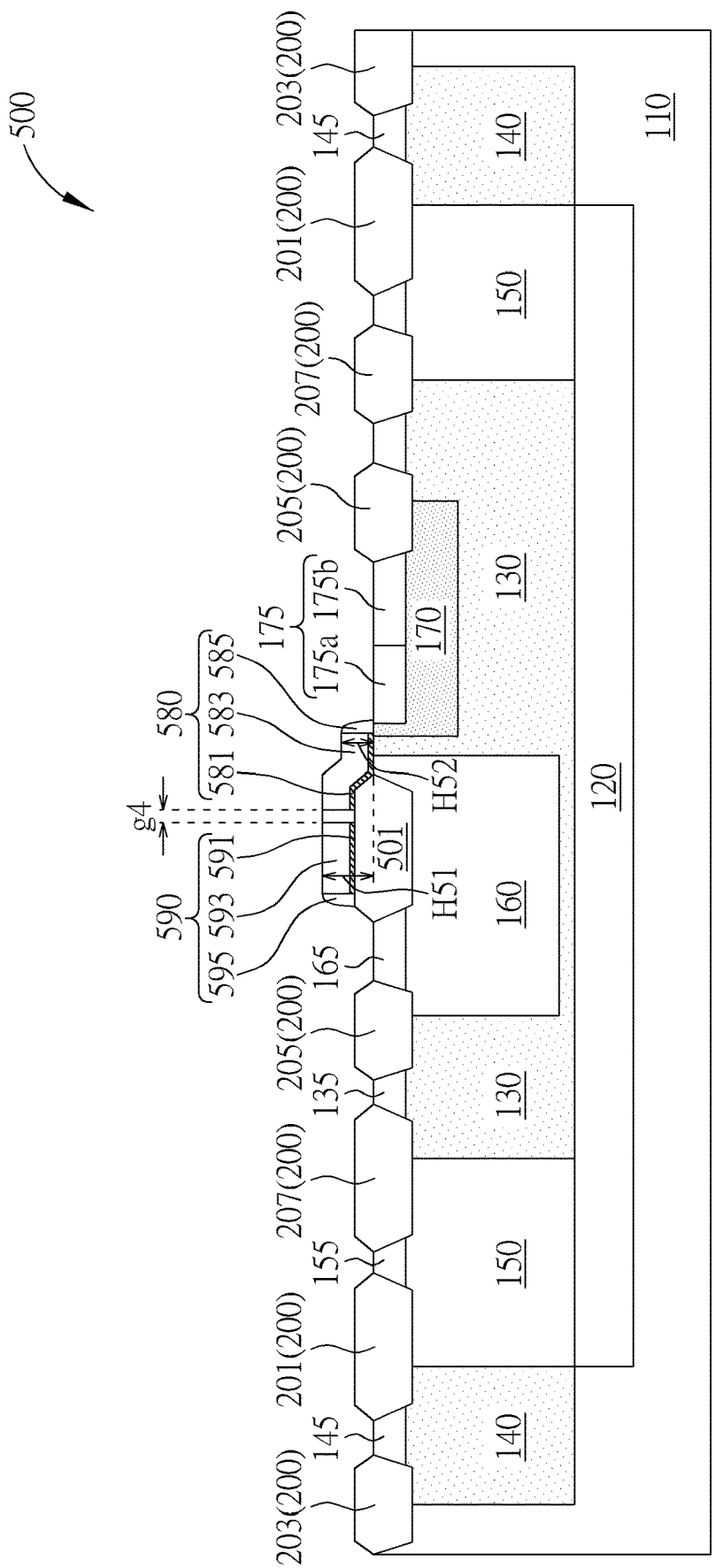
FIG. 4 is a schematic diagram illustrating a cross-sectional view of a high voltage semiconductor device according to a fourth embodiment of the present disclosure.

Next, as shown in FIG. 4, FIG. 4 illustrates a high voltage semiconductor device 500 according to the fourth embodiment of the present disclosure. The structure of the high voltage semiconductor device 500 of the present embodiment is substantially similar to the high voltage semiconductor device 300 in the aforementioned second embodiment or the high voltage semiconductor device 400 in the aforementioned third embodiment, and all similarity between the present embodiment and the aforementioned embodiment will not be redundantly described hereinafter. The difference between the present embodiment and the aforementioned embodiment is mainly in that an insulating layer 501 is additionally disposed between the source 175 and the drain 163, and the insulating layer 501 is for example includes a field oxide layer formed through a local silicon oxidation process, wherein the local silicon oxidation process may be optionally carried out together with the formation of the aforementioned insulating structures 200. Thus, the insulating layer 501 may be partially disposed in the substrate 110 and partially protruded from the top surface of the substrate 110, and two independently disposed electrode structures (such as a first gate structure 580 and a second gate structure 590 shown in FIG. 4) may be completely or partially straddled on the insulating layer 501 in the subsequent process.

Likewise, the first gate structure 580 and the second gate structure 590 may respectively include a gate dielectric layer 581, 591 and a gate electrode 583, 593 stacked on the substrate 110, and a spacer 585, 595 surrounding the gate dielectric layer 581, 591 and the gate electrode 583, 593. Precisely, the first gate structure 580 is also disposed over the interface between the first well region 160 and the second well region 130, and the second gate structure 590 is completely disposed within the first well region 160, adjacent to the first gate structure 580. With these arrangements, the gate electrode 583 of the first gate structure 580 and the gate electrode 593 of the second gate structure 590 may be separately from each other, and the gap g4 between the gate electrode 583 and the gate electrode 593 may be about 0.1 µm to 0.2 µm, preferably being about 0.13 µm to 0.16 µm, but not limited thereto. Preferably, the gap g4 between the gate electrode 583 and the gate electrode 593 is also located within the area of first well region 160, over the insulating layer 501, as shown in FIG. 4.

In the present embodiment, the second gate structure 590 is completely disposed over the insulating layer 501, so that the distance H51 between the gate electrode 593 and the substrate 110 is a certain value, wherein the distance H51 is referred to as the height from the top surface of the gate electrode 593 to the top surface of the substrate 110. On the other hand, a portion of the first gate structure 580 is straddled on the insulating layer 501 and another portion of the first gate structure 580 is directly disposed on the substrate 110, so that the distance H51 between the portion of the gate electrode 583 which is disposed on the insulating layer 501 and the substrate 110, and the distance H52 between the another portion of the gate electrode 583 which is directly disposed on the substrate 110 and the substrate 110 may be different from each other. Accordingly, the distance H52 directly from the top surface of gate electrode 583 of first gate structure 580 to the top surface of substrate 110, the distance H51 from the top surface of gate electrode 583 of first gate structure 580 through the insulating layer 501 to the top surface of substrate 110, and the distance H52 from the top surface of gate electrode 593 of second gate structure 590 through the insulating layer 501 to the top surface of substrate 110 may generate field plates with two different heights, which may also increase the breakdown voltage of the high voltage semiconductor device 500.

Figure 5:
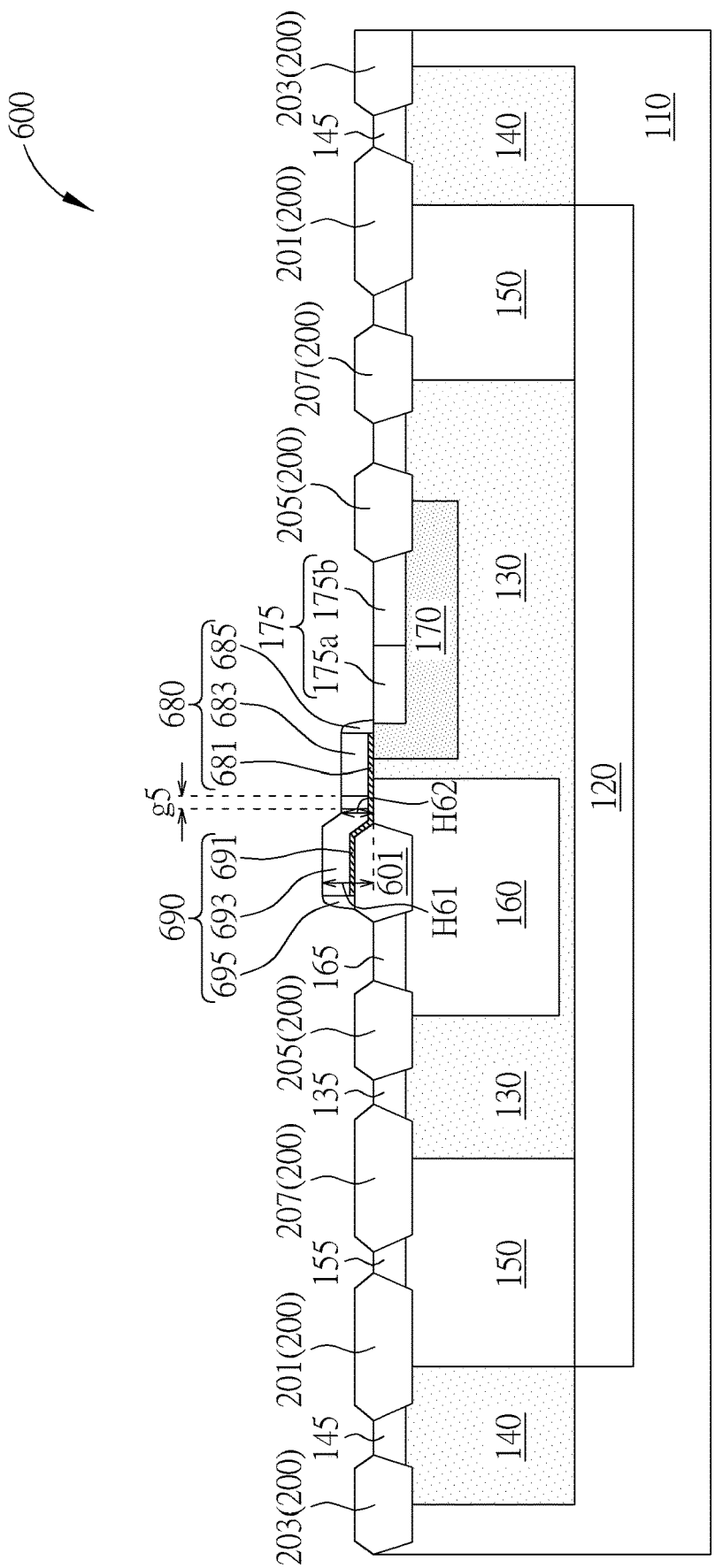
FIG. 5 is a schematic diagram illustrating a cross-sectional view of a high voltage semiconductor device according to a fifth embodiment of the present disclosure.

Then, as shown in FIG. 5, which illustrate a high voltage semiconductor device 600 according to the fifth embodiment of the present disclosure. The structure of the high voltage semiconductor device 600 of the present embodiment is substantially similar to the high voltage semiconductor device 500 in the aforementioned fourth embodiment, and all similarity between the present embodiment and the aforementioned embodiment will not be redundantly described hereinafter. The difference between the present embodiment and the aforementioned embodiment is mainly in that the first gate structure 680 of the high voltage semiconductor device 600 is directly disposed on the substrate 110, and the second gate structure 690 is partially disposed on an insulating layer 601. In the present embodiment, the insulating layer 601 may also include a field oxide layer formed through a local silicon oxidation process, and the formation thereof may also be carried out together with the formation of the aforementioned insulating structures 200.

Likewise, the first gate structure 680 and the second gate structure 690 may respectively include a gate dielectric layer 681, 691 and a gate electrode 683, 693 stacked on the substrate 110, and a spacer 685, 695 surrounding the gate dielectric layer 681, 691 and the gate electrode 683, 693. Precisely, the first gate structure 680 is also disposed over the interface between the first well region 160 and the second well region 130, and the second gate structure 690 is completely disposed within the first well region 160, adjacent to the first gate structure 680. With these arrangements, the gate electrode 683 of the first gate structure 680 and the gate electrode 693 of the second gate structure 690 may also be separately from each other, and the gap g5 between the gate electrode 683 and the gate electrode 693 may be about 0.1 µm to 0.2 µm, preferably being about 0.13 µm to 0.16 µm, but not limited thereto. In the present embodiment, the spacers 685, 695 both at one side of the first gate structure 680 and the second gate structure 690 may merge with each other to fill up the gap g5, and then, the gate dielectric layers 681, 691 of the first gate structure 680 and the second gate structure 690 are connected with each other to be monolithic, as shown in FIG. 5. Accordingly, the gap g5 between the gate electrodes 683 and the gate electrode 693 may be disposed over the gate dielectric layers 681, 691, and which is still located within the area of the first well region 160, as shown in FIG. 5.

Furthermore, a portion of the second gate structure 690 is straddled on the insulating layer 601 and another portion of the second gate structure 690 is directly disposed on the substrate 110, so that, the distance H61 between the portion of the gate electrode 693 which is disposed on the insulating layer 601 and the substrate 110, and the distance H62 between the another portion of the gate electrode 493 which is directly disposed on the substrate 110 and the substrate 110 may be different from each other. Accordingly, the distance H62 from the top surface of gate electrode 683 of first gate structure 680 directly to the top surface of substrate 110, the distance H62 from the top surface of gate electrode 693 of second gate structure 690 directly to the top surface of substrate 110, and the distance H61 from the top surface of gate electrode 693 of second gate structure 690 through the insulating layer 601 to the top surface of substrate 110 may generate field plates with two different heights, which is also beneficial on improving the breakdown voltage of the high voltage semiconductor device 600.

Figure 6:
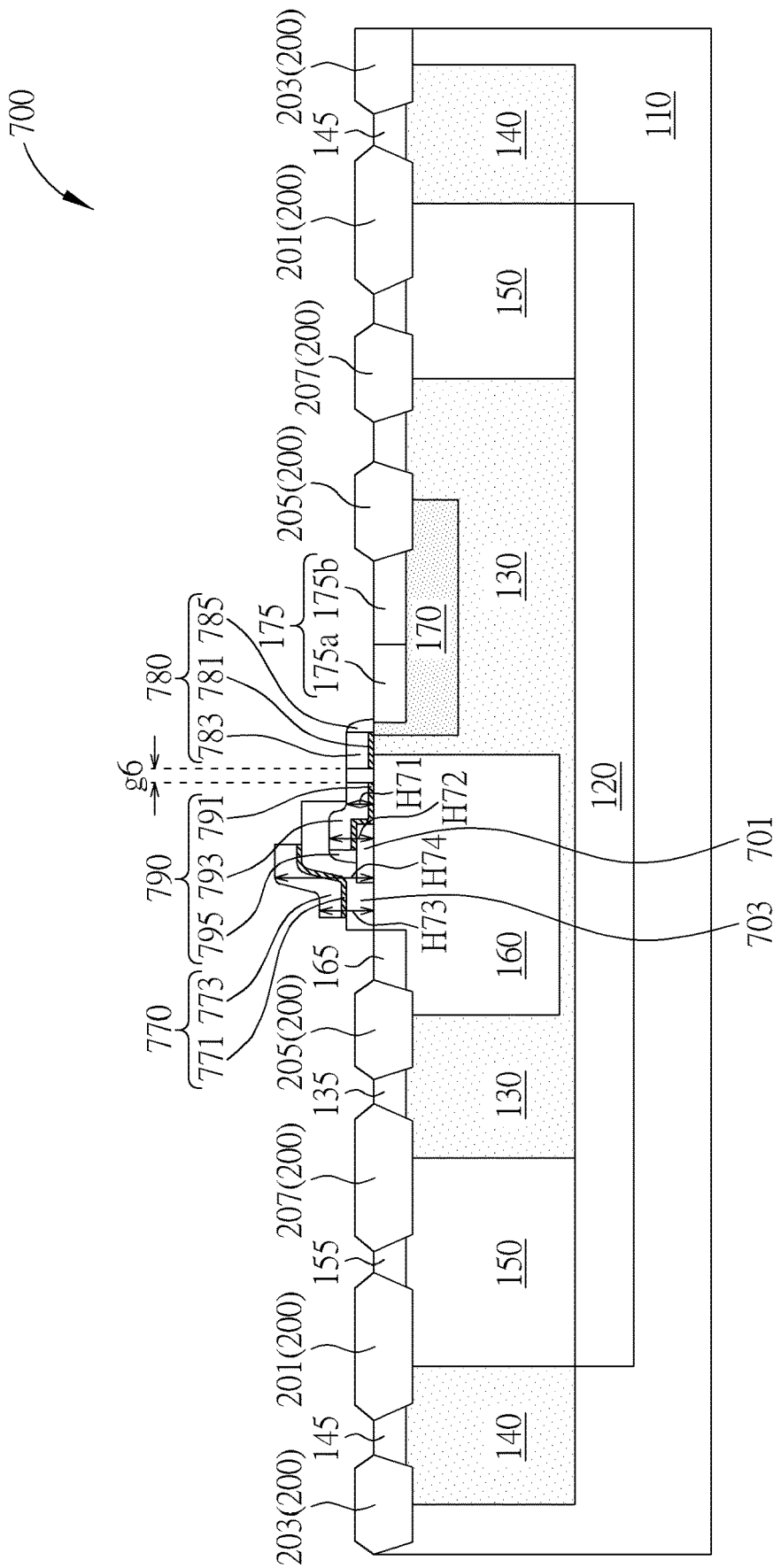
FIG. 6 is a schematic diagram illustrating a cross-sectional view of a high voltage semiconductor device according to a sixth embodiment of the present disclosure.

As shown in FIG. 6, FIG. 6 illustrates a high voltage semiconductor device 700 according to the sixth embodiment of the present disclosure. The structure of the high voltage semiconductor device 700 of the present embodiment is substantially similar to the high voltage semiconductor device 400 in the aforementioned third embodiment, and all similarity between the present embodiment and the aforementioned embodiment will not be redundantly described hereinafter. The difference between the present embodiment and the aforementioned embodiment is mainly in that an insulating layer 701 is additionally disposed between the source 175 and the drain 163, and the insulating layer 701 is for example includes a dielectric material layer such as a silicon oxide layer which is formed through a deposition process, with all of the parameters and conditions of the insulating layer 701 being adjustable based on practical product requirements. Also, the high voltage semiconductor device 700 further includes another electrode structure, for example a capacitor structure 770, disposed on the insulating layer 701 and the second gate structure 790.

Likewise, the first gate structure 780 and the second gate structure 790 may respectively include a gate dielectric layer 781, 791 and a gate electrode 783, 793 stacked on the substrate 110, and a spacer 785, 795 surrounding the gate dielectric layer 781, 791 and the gate electrode 783, 793. Precisely, the first gate structure 780 is also disposed over the interface between the first well region 160 and the second well region 130, and the second gate structure 790 is completely disposed within the first well region 160, adjacent to the first gate structure 780. With these arrangements, the gate electrode 783 of the first gate structure 780 and the gate electrode 793 of the second gate structure 790 may also be separately from each other, and the gap g6 is still located within the area of the first well region 160, as shown in FIG. 6. The gap g6 between the gate electrode 783 and the gate electrode 793 may be about 0.1 µm to 0.4 µm, preferably being about 0.13 µm to 0.16 µm, but not limited thereto.

In the present embodiment, an insulating layer 703 is further disposed on the second gate structure 790, and a portion of the insulating layer 703 covers the first well region 160, the insulating layer 701, and the second gate structure 790, as shown in FIG. 6. The insulating layer 703 for example includes a dielectric material layer such as a silicon oxide layer which is formed through a deposition process, but is not limited thereto. Preferably, the fabricating process of the insulating layer 703 may be optionally carried out together with the general manufacturing process of the high voltage semiconductor device 700, for example, which may be optionally performed together with the formation of a protective layer (not shown in the drawing) which is formed to prevent the partial substrate 110 from forming silicide. Alternately, the fabricating process of the insulating layer 703 may also be formed through other manufacturing processes. Then, a dielectric layer 771 and a conductive layer 773 are sequentially formed on the insulating layer 703 to partially overlap with the second gate structure 790 disposed underneath. In one embodiment, the conductive layer 773 may provide different voltages to achieve different functions. For example, if the conductive layer 773 is electrically connected to the source 175 through an external circuit (not shown in the drawings), the conductive layer 773, the dielectric layer 771 and the gate electrode 793 of the second gate structure 790 may together form a capacitor structure 770, such as a metal-insulator-polysilicon (MIP) structure including a stack structure of a polysilicon, an insulator and a conductor, with the dielectric layer 771 being functioned as a MIP insulator. With these arrangements, the breakdown voltage of the high voltage semiconductor device 700 may be improved, and also, the parasitic capacitance ($C_{gd}$) between the gate structures and the drain 165 of the high voltage semiconductor device 700 may be reduced. On the other hand, if the conductive layer 773 is electrically connected to the gate electrode 783 of the first gate structure 780 through another external circuit (not shown in the drawings), the on-state resistance of the semiconductor device 700 may be reduced.

Accordingly, the second gate structure 790 which is partially straddled on the insulating layer 701 may also generate the field plates with two different heights, for example, the field plates including the distance H71 from the top surface of the gate electrode 793 of the second gate structure 790 directly to the top surface of the substrate 110 and the distance H72 from the top surface of the gate electrode 793 of the second gate structure 790 through the insulating layer 701 to the top surface of the substrate 110.

In addition, the distance H73 from the conductive layer 773 of the capacitor structure 770 through the dielectric layer 771 and the insulating layer 703 to the top surface of the substrate 110, or the distance H74 from the conductive layer 773 of the capacitor structure 770 through the dielectric layer 771, the insulating layer 703 and the insulating layer 701 to the top surface of the first well region 160 may all achieve the field plates with different heights, so as to further improve the breakdown voltage of the high voltage semiconductor device 700 in the present embodiment.

Figure 7:
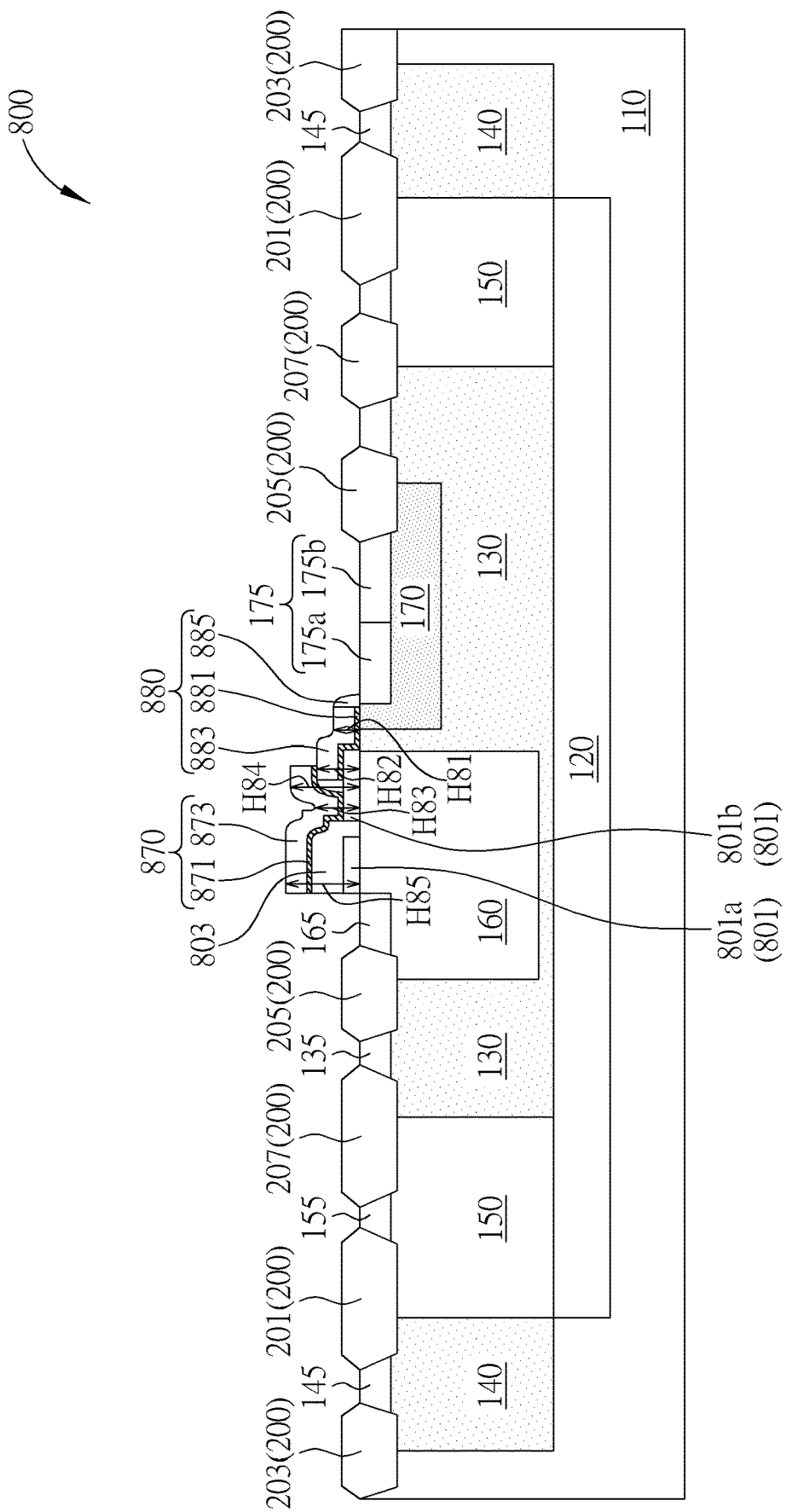
FIG. 7 is a schematic diagram illustrating a cross-sectional view of a high voltage semiconductor device according to a seventh embodiment of the present disclosure.

Please refer to FIG. 7, which illustrate a high voltage semiconductor device 800 according to the seventh embodiment of the present disclosure. The structure of the high voltage semiconductor device 800 of the present embodiment is substantially similar to the high voltage semiconductor device 300 in the aforementioned second embodiment, and all similarity between the present embodiment and the aforementioned embodiment will not be redundantly described hereinafter. The difference between the present embodiment and the aforementioned embodiment is mainly in that an insulating layer 801 is additionally disposed between the source 175 and the drain 163, and the insulating layer 801 further includes two separated portions 801a, 801b. Accordingly, two independently disposed electrode structures (such as a gate structure 880 and a capacitor structure 870 as shown in FIG. 7) may be respectively straddled on the insulating layer 801, for achieving more field plates with various heights. The insulating layer 801 for example includes a dielectric material layer such as a silicon oxide layer formed through a deposition process, and which is further patterned into the a first portion 801a and a second portion 801b.

Precisely, the gate structure 880 is disposed over the interface between the first well region 160 and the second well region 130, to partially dispose over the second portion 801b of the insulating layer 801. As shown in FIG. 7, the gate structure 880 include a gate dielectric layer 881 and a gate electrode 883 stacked on the substrate 110, and a spacer 885 surrounding the gate dielectric layer 881 and the gate electrode 883. On the other hand, the capacitor structure 870 is disposed on the insulating layer 801, and the capacitor structure 870 may be together formed by a conductive layer 873, a dielectric layer 871 and the gate electrode 883, wherein, the capacitor structure 870 is completely disposed within the first well region 160, to partially overlap with the gate structure 880 and the second portion 801b of the insulating layer 801 disposed underneath. Also, in the present embodiment, an insulating layer 803 is further formed between the capacitor structure 870 and the insulating layer 801, to partially cover the first well region 160 and the first portion 801a of the insulating layer 801. Likewise, the insulating layer 803 includes a dielectric material layer such as a silicon oxide layer which is formed through a deposition process, and the formation thereof may be carried out together with the formation of a protective layer (not shown in the drawing) which is used to protect the partial substrate 110 from forming silicide, or carried out independently.

In the present embodiment, the distance H81 from the top surface of the gate electrode 883 of the gate structure 880 directly to the top surface of the substrate 110, and the distance H82 from the top surface of the gate electrode 883 of the gate structure 880 through the second portion 801b of the insulating layer 801 to the top surface of the substrate 110 may also generate the field plates with two different heights (H81, H82). In addition, the distance H83 from the conductive layer 873 of the capacitor structure 870 through the dielectric layer 871 and the second portion 801b of the insulating layer 801 to the top surface of the substrate 110, the distance H84 from the conductive layer 873 of the capacitor structure 870 which is straddled on the gate structure 880 through the dielectric layer 871 and the second portion 801b of the insulating layer 801 to the top surface of the substrate 110, the distance H85 from the conductive layer 873 of the capacitor structure 870 through the dielectric layer 871, the insulating layer 803 and the first portion 801a of the insulating layer 801 to the top surface of the substrate 110 and the like may achieve the field plates with at least five different heights (including H81, H82, H83, H84, H85), thereby reducing the surface field to improve the breakdown voltage of the high voltage semiconductor device 800.

Figure 8:
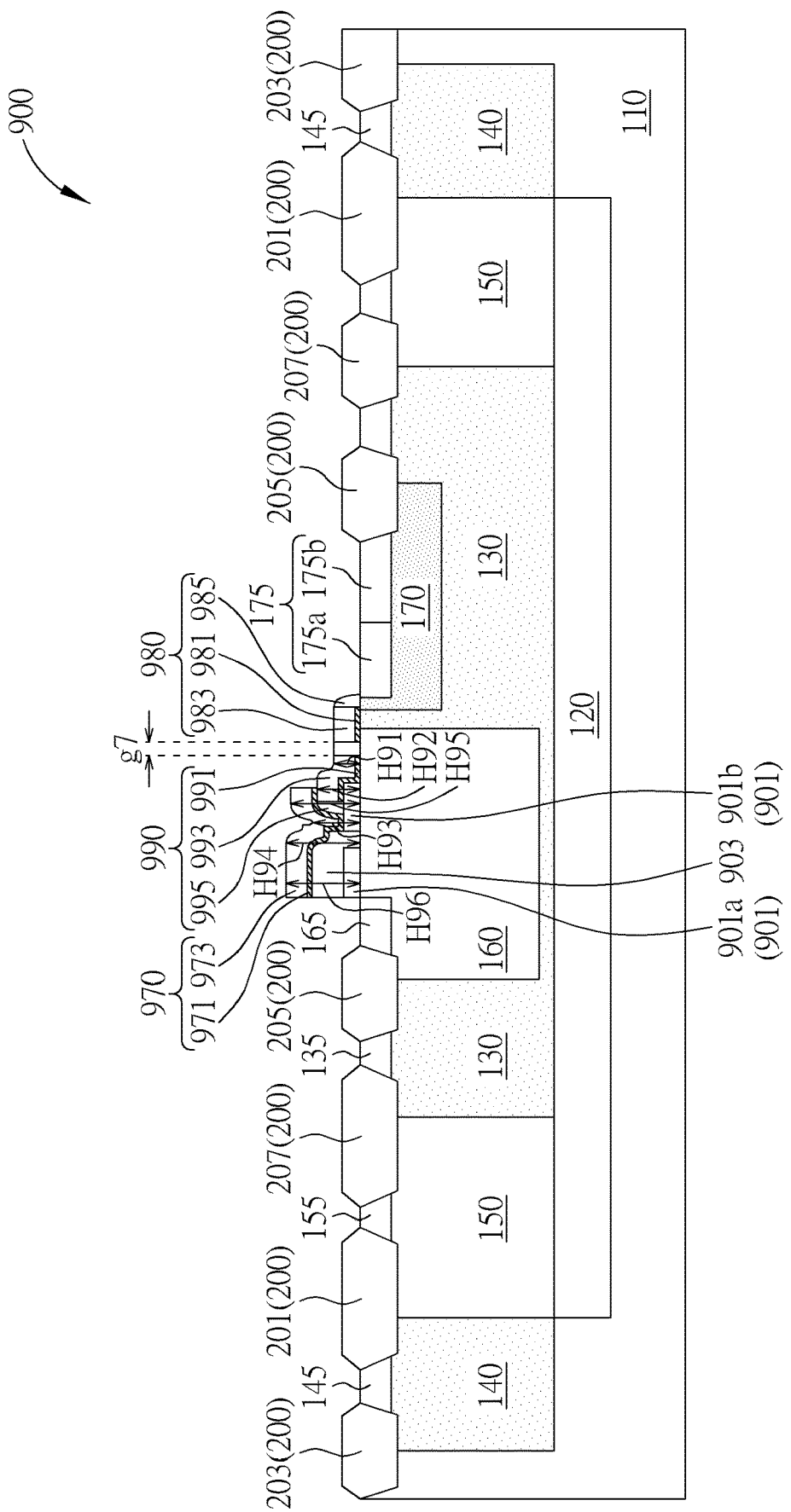
FIG. 8 is a schematic diagram illustrating a cross-sectional view of a high voltage semiconductor device according to an eighth embodiment of the present disclosure.

Please refer to FIG. 8, which illustrate a high voltage semiconductor device 900 according to the eighth embodiment of the present disclosure. The structure of the high voltage semiconductor device 900 of the present embodiment is substantially similar to the high voltage semiconductor device 700 in the aforementioned sixth embodiment, and all similarity between the present embodiment and the aforementioned embodiment will not be redundantly described hereinafter. The difference between the present embodiment and the aforementioned embodiment is mainly in that an insulating layer 901 is additionally disposed between the source 175 and the drain 163, and the insulating layer 901 further includes two separated portions 901a, 901a. Accordingly, three independently disposed electrode structures (such as a first gate structure 980, a second gate structure 990, and a capacitor structure 970 shown in FIG. 9) may be respectively straddled on the two portions 901a, 901b of the insulating layer 901, and a conductive layer 973 may have a gradient height, for achieving more field plates with various heights to reduce the surface field.

Likewise, the first gate structure 980 and the second gate structure 990 may respectively include a gate dielectric layer 981, 991 and a gate electrode 983, 993 stacked on the substrate 110, and a spacer 985, 995 surrounding the gate dielectric layer 981, 991 and the gate electrode 983, 993. Precisely, the first gate structure 980 is also disposed over the interface between the first well region 160 and the second well region 130, and the second gate structure 990 is completely disposed within the first well region 160, wherein the second gate structure 990 is partially straddled on the second portion 901b of the insulating layer 901, adjacent to the first gate structure 980, as shown in FIG. 8. With these arrangements, the gate electrode 983 of the first gate structure 980 and the gate electrode 993 of the second gate structure 990 may also be separately from each other, and the gap g7 between the gate electrode 983 and the gate electrode 993 may be also located within the area of first well region 160, being about 0.1 μm to 0.2 μm, preferably being about 0.13 μm to 0.16 μm, but not limited thereto.

Furthermore, in the present embodiment, an insulating layer 903 is further formed to partially cover the first well region 160 and the first portion 901a of the insulating layer 901 disposed underneath. Likewise, the insulating layer 903 includes a dielectric material layer such as a silicon oxide layer which is formed through a deposition process, and the formation thereof may be carried out together with the formation of a protective layer (not shown in the drawing) which is formed to prevent the partial substrate 110 from forming silicide, or carried out independently. Then, the capacitor structure 970 is disposed on the insulating layer 903, with the capacitor structure 970 being together formed of a conductive layer 973, a dielectric layer 971 and the gate electrode 993. The capacitor structure 970 is completely disposed within the first well region 160, to completely overlap with the insulating layer 903 and the first portion 901a of the insulating layer 901 disposed underneath, and to partially overlap with the second portion 901b of the insulating layer 901 and the second gate structure 990 disposed underneath, as shown in FIG. 8.

In the above embodiment, while the first electrode structure includes a first gate structure and the second electrode structure includes a second gate structure, the first electrode structure is disposed at the boundary between the first well region 160 and the second well region 130, but is not limited thereto. In another embodiment, the first electrode structure and the second electrode structure do not cover the boundary between the first well region 160 and the second well region 130.

In the present embodiment, the distance H91 from the top surface of the gate electrode 993 of the second gate structure 990 directly to the top surface of the substrate 110, and the distance H92 from the top surface of the gate electrode 993 of the second gate structure 990 through the second portion 901b of the insulating layer 901 to the top surface of the substrate 110 may also generate the field plates with two different heights (H91, H92). In addition, the distance H93 from the conductive layer 973 of the capacitor structure 970 through the dielectric layer 971 and the second portion 901b of the insulating layer 901 to the top surface of the substrate 110, the distance H94 from the conductive layer 973 of the capacitor structure 970 through the dielectric layer 971, the insulating layer 903, and the first portion 901a of the insulating layer 901 to the top surface of the substrate 110, the distance H95 from the conductive layer 973 of the capacitor structure 970 which is straddled on the second gate structure 990 through the dielectric layer 971 and the second portion 901b of the insulating layer 901 to the top surface of the substrate 110, the distance H96 from the conductive layer 973 through the dielectric layer 971, the insulating layer 903 and the first portion 901a of the insulating layer 901 to the top surface of the substrate 110, and the like may achieve the field plates with at least six different heights (including H91, H92, H93, H94, H95 and H96), thereby effectively reducing the surface field to improve the breakdown voltage of the high voltage semiconductor device 900.

Overall speaking, the high voltage semiconductor device of the present disclosure includes two or more than two independently arranged electrode structures, such as a gate structure or a capacitor structure including a stack structure of polysilicon, an insulator and a conductor, and several insulating layers disposed between the two electrode structures and the substrate, with the insulating layers having different thicknesses, being arranged at different positions or being covered by the two electrode structures with different percentages. Accordingly, the distances between the top surface of each of the electrode structures and the top surface of the substrate, or the distances between the top surface of the electrode structures and the top surface of the substrate through different insulating layers, different dielectric layers or a combination of the insulating layers and dielectric layers, may have various heights, so that, several field plates with various height may be formed thereby within the high voltage semiconductor device to achieve significantly higher breakdown voltage. Under the embodiments of the present disclose, the breakdown voltage of the high voltage semiconductor device may be effectively improved without further increasing the lateral length of the field plate structure. In addition, the present disclosure further improve the problem of excessively high parasitic capacitance between the gate and the drain, so as to achieve the better device reliability and device performance of the high voltage semiconductor device. In this way, the present disclosure may be applied on various high voltage semiconductor devices. Although the aforementioned embodiments are all exemplified on an n-type LDMOS, people in the arts should easily understand the present disclose may also be applied on various types of the high voltage semiconductor devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high voltage semiconductor device, comprising:
   a first well region, disposed in the substrate, the first well region having a first conductive type;
   a second well region, disposed in the substrate and adjacent to the first well region, the second well region having a second conductive type being complementary to the first conductive type;
   a first insulating layer, disposed on the first well region;
   a source, disposed within the second well region;
   a drain, disposed within the first well region; and
   a first electrode structure and a second electrode structure, disposed on the substrate, wherein the first electrode structure and the second electrode structure respectively comprises a gate dielectric layer and a gate electrode stacked form bottom to top, the gate dielectric layer of the first electrode structure directly contacts a top surface of the first insulating layer and a top surface of the substrate, distances between a non-planar top surface of the first electrode structure and a top surface of the substrate comprises a first height and a second height which are different from each other, and at least one of the first electrode structure and the second electrode structure is a gate structure.

2. The high voltage semiconductor device according to claim 1, wherein the first electrode structure covers a portion of the first insulating layer and is disposed over an interface between the first well region and the second well region, and the second electrode structure is disposed on the first well region.

3. The high voltage semiconductor device according to claim 1, wherein the second electrode structure is disposed on the first well region and covers a portion of the first insulating layer.

4. The high voltage semiconductor device according to claim 1, wherein the first electrode structure and the second electrode structure are separately disposed.

5. The high voltage semiconductor device according to claim 1, wherein the second electrode structure is partially overlapped with the first electrode structure.

6. The high voltage semiconductor device according to claim 5, wherein the second electrode structure comprises a capacitor structure and the capacitor structure comprises a gate electrode, a dielectric layer and a conductive layer stacked sequentially.

7. The high voltage semiconductor device according to claim 6, wherein the first electrode structure and the second electrode structure share the gate electrode.

8. The high voltage semiconductor device according to claim 6, wherein a distance between a top surface of the second electrode structure to the top surface of the substrate comprises a third height, a fourth height, and a fifth height, and the first height, the second height, the third height, the fourth height, and the fifth height are different from each other.

9. The high voltage semiconductor device according to claim 3, wherein the second electrode structure is disposed over an interface between the first well region and the second well region.

10. The high voltage semiconductor device according to claim 1, wherein the first insulating layer comprises a first portion and a second portion which are separately disposed.

11. The high voltage semiconductor device according to claim 1, further comprising:
    a second insulating layer, and the second electrode structure is disposed on the second insulating layer.

12. The high voltage semiconductor device according to claim 11, further comprising:
    a third electrode structure separately disposed from the first electrode structure, wherein the second electrode structure and the third electrode structure each comprises a gate structure and a capacitor structure.

13. The high voltage semiconductor device according to claim 1, wherein the first electrode structure and the second electrode structure are separated from each other, and there is a gap between the first electrode structure and the second electrode structure is 0.1 μm to 0.2 μm.

14. The high voltage semiconductor device according to claim 1, wherein the second electrode structure comprises a non-planar surface.

* * * * *